United States Patent
Suzuki et al.

[11] Patent Number: 5,973,395
[45] Date of Patent: Oct. 26, 1999

[54] IC PACKAGE HAVING A SINGLE WIRING SHEET WITH A LEAD PATTERN DISPOSED THEREON

[75] Inventors: Etsuji Suzuki, Yokohama; Akira Yonezawa, Tokyo; Hidehisa Yamazaki, Okayama-ken; Hiroshi Odaira, Chigasaki, all of Japan

[73] Assignee: Yamaichi Electronics Co., Ltd., Tokyo, Japan

[21] Appl. No.: 08/848,585

[22] Filed: Apr. 29, 1997

[30] Foreign Application Priority Data

Apr. 30, 1996 [JP] Japan ................................ 8-109767

[51] Int. Cl.⁶ ........................... H01L 23/48; H01L 23/52
[52] U.S. Cl. ..................... 257/692; 257/693; 257/696; 257/706
[58] Field of Search ................................. 257/701, 702, 257/703, 700, 706, 707, 664, 778, 786, 776, 773, 692, 693, 696

[56] References Cited

U.S. PATENT DOCUMENTS

| | | |
|---|---|---|
| 3,641,401 | 2/1972 | Lynch . |
| 3,838,443 | 9/1974 | Laighton . |
| 3,908,186 | 9/1975 | Anazawa et al. . |
| 3,930,115 | 12/1975 | Uden et al. . |
| 4,376,287 | 3/1983 | Sechi . |
| 5,049,978 | 9/1991 | Bates et al. . |
| 5,081,520 | 1/1992 | Yoshii et al. . |
| 5,198,886 | 3/1993 | Verspeak . |
| 5,362,656 | 11/1994 | McMahon . |
| 5,450,283 | 9/1995 | Lin et al. . |
| 5,528,458 | 6/1996 | Yasuho et al. . |
| 5,581,122 | 12/1996 | Chao et al. . |

*Primary Examiner*—Sheila V. Clark
*Attorney, Agent, or Firm*—Wenderoth, Lind & Ponack, L.L.P.

[57] ABSTRACT

An IC package is provided that has a flexible wiring sheet, including an upper portion, a lower portion and a side portion which is wound around a base member over an upper surface, side surfaces and a lower surface of the base member. An IC is loaded on an upper surface of the upper flexible wiring sheet covering the upper surface of the base member. The IC is connected to an electrode provided on an upper lead pattern portion laid along the upper surface of the flexible wiring sheet. The lead pattern is extended from the upper flexible wiring sheet to the lower flexible wiring sheet via the side surfaces of the flexible wiring sheet covering side surfaces of the base member. An electrode to be connected with an object is arranged on the lower lead pattern portion which is formed on the lower flexible wiring sheet, and overall the IC or an IC connection portion is sealed on the upper surface of the upper flexible wiring sheet.

28 Claims, 3 Drawing Sheets

IC PACKAGE HAVING A SINGLE WIRING SHEET WITH A LEAD PATTERN DISPOSED THEREON

BACKGROUND OF THE INVENTION

1. Field of the Invention

This invention relates to a BGA type IC package and the like having a plurality of electrodes arranged on a lower surface thereof. More particularly, it relates to an IC package in which a high density arrangement of external terminals is realized with a small-sized simple structure in such a BGA type IC package and the like.

2. Brief Description of the Prior Art

A typical BGA type IC package includes hundreds of terminals. A group of such terminals is divided into a plurality of unit groups of terminals. The unit groups of terminals are pierced for connection through wiring layers composed of several laminations. The unit terminals are changed in position at the lead patterns provided on each layer. A plurality of external terminals are uniformly rearranged on a lower surface of the lowermost layer.

There are also known other types of conventional IC packages. They are a dual-in-package (DIP) and a quad flat package (QFP).

One type having a large number of IC terminals of finely-pitched arrangement is a tape automated bonding structure (TAB). In this type, an IC is loaded on a thin flat flexible wiring sheet and bonded, and the pitches are changed on the wiring sheet.

However, with the progress in IC technology, the degree of integration is remarkably enhanced, and with the increase in the number of the terminals and in the size of the IC, the package styles of the conventional DIP, QFP and TAB are required to be too large in size. Recently, there were proposed a quad flat non-lead (QFN), a ball grid array (BGA), and a chip size package (CSP) which are all intended to avoid increasing the size of the IC packages. Some of them are already put into actual use.

However, it is necessary for an IC package of this type to have an interposer for rearranging the terminals group of the IC. For example, the BGA type IC package requires three to eight wiring layers as the interposer, depending on the density of the terminals. Accordingly, the structure becomes complicated, a high degree of technique is required, and the cost is very high.

The present invention has been accomplished in view of the above.

SUMMARY OF THE INVENTION

It is, therefore, an object of the present invention to provide an IC package which is simple in structure and low in manufacturing cost, without sacrificing the high density arrangement of terminals found in the BGA type IC package, for example.

In order to achieve the above object, an IC package is provided that has a flexible wiring sheet including an upper portion, a lower portion and a side portion which is wound around a base member over an upper surface, outer side surfaces and a lower surface of the base member. An IC is loaded on an upper surface of the upper flexible wiring sheet covering the upper surface of the base member. The IC is connected to an electrode provided on an upper lead pattern portion laid along the upper flexible wiring sheet. The lead pattern is extended from the upper flexible wiring sheet to the lower flexible wiring sheet via the side flexible wiring sheet covering outer side surfaces of the base member. An electrode to be connected with an object is arranged on the lower lead pattern portion which is formed on the lower flexible wiring sheet, and overall the IC or an IC connection portion is sealed on the upper surface of the upper flexible wiring sheet.

In another embodiment of the present invention, an IC package is provided that has a flexible wiring sheet including an upper portion, a lower portion and a side portion which is bonded to a base member in a manner to cover an upper surface and side surfaces of the base member. An IC is loaded on an upper surface of the upper flexible wiring sheet covering the upper surface of the base member. The IC is connected to an electrode provided on an upper lead pattern portion laid along the upper flexible wiring sheet. A side lead pattern portion formed on the side flexible wiring portion covering the base member side surface serves as a thermally bonding portion with respect to a wiring circuit board by a conductive metal, and overall the IC or an IC connection portion is sealed on the upper surface of the upper flexible wiring sheet.

The flexible wiring sheet preferably includes a double surface wiring sheet on which each of the upper and lower surfaces is provided with a lead pattern.

The base member preferably includes laminated plates which are attached to a central portion and end portions of the flexible wiring sheet and vertically superimposed.

The base member may form a heat radiating member made of a heat absorptive metal.

It is preferred that the upper flexible wiring sheet interposed between the IC and the heat radiating member is provided with a through-hole so that heat flows readily from the IC to the heat radiating member. Heat flows through a heat adoptive path formed of a heat conductive material filled in the through-hole.

It is also preferred that the heat radiating member has a heat radiating fin on the end portion which is exposed from the flexible wiring sheet.

The above and other objects and advantageous features of the present invention will become more apparent to those skilled in the art by reading the detailed description of the embodiments with reference to the accompanying drawings.

DETAILED DESCRIPTION OF THE EMBODIMENTS

Figure 1:
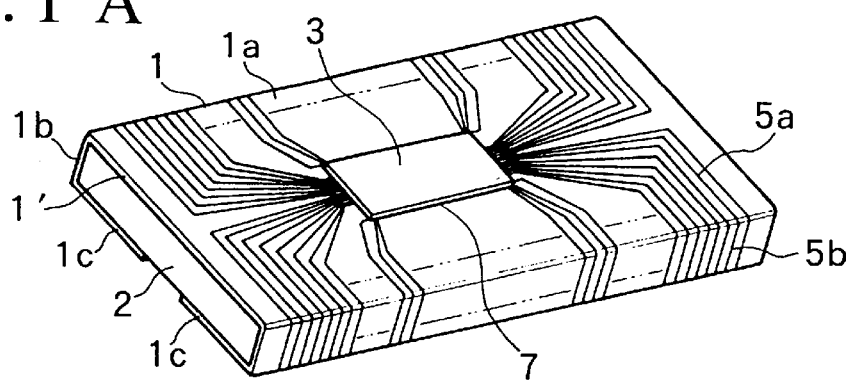
FIG. 1A is a perspective view showing a first embodiment of an IC package.
FIG. 1B is a sectional view thereof.
FIG. 1C is a bottom view thereof.
FIG. 1D is a development view of a flexible wiring sheet in the IC package.
Figure 1:
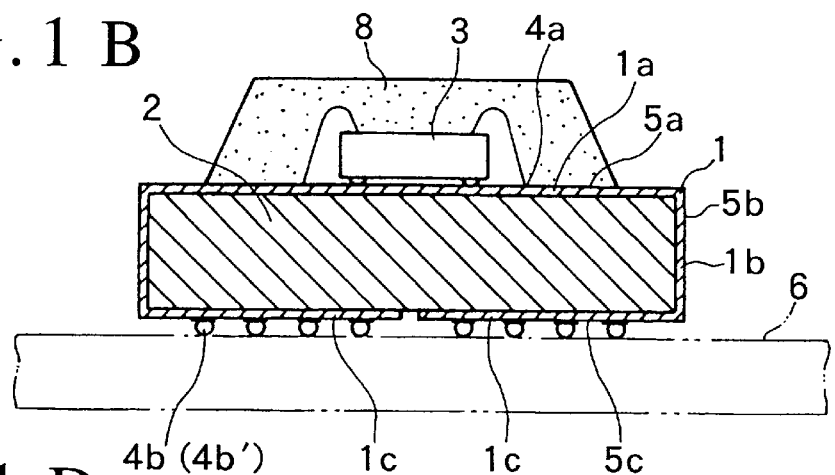
Figure 1:
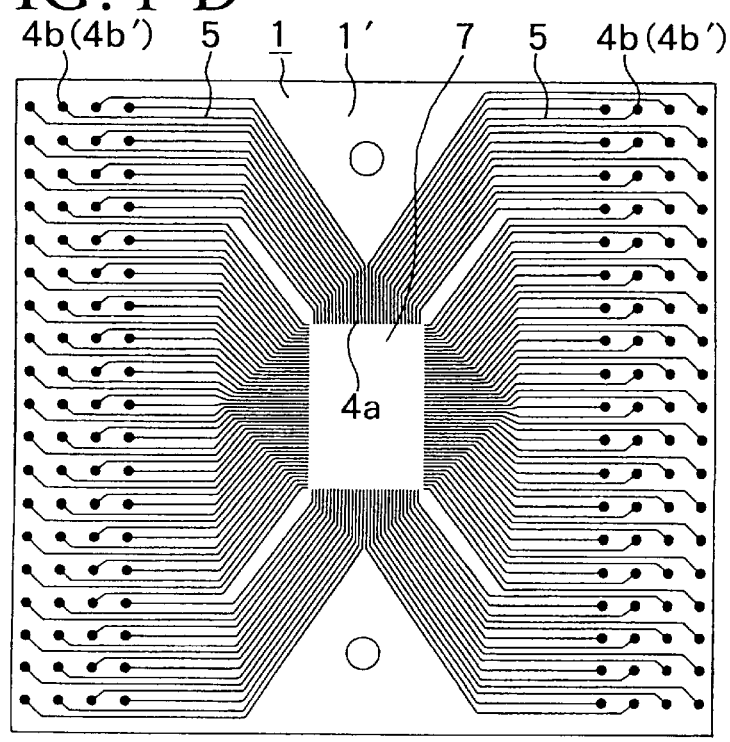
Figure 1:
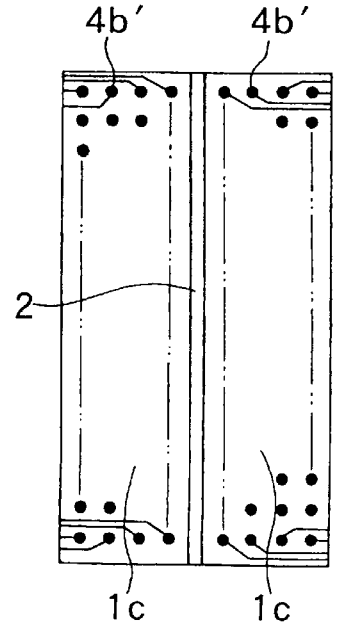

Several embodiments of the present invention will now be described in detail with reference to the accompanying drawings which constitute a part of this specification.

FIGS. 1A–1D show an embodiment of an IC package according to the present invention. The IC package of these Figures comprises a flexible wiring sheet 1 including an upper flexible wiring sheet surface 1a, a side flexible wiring sheet surface 1b, and a lower flexible wiring sheet surface 1c. The IC package further comprises a base member. The flexible wiring sheet 1 is wound around the base member 2 over an upper surface, outer side surfaces, and a lower surface of the base member 2. An IC (semiconductor chip) 3 is loaded on an upper surface of the upper flexible wiring sheet 1a covering the upper surface of the base member 2. The IC 3 is connected to an electrodes 4a group provided on an upper lead pattern 5a laid along the upper flexible wiring sheet surface 1a.

A lead pattern 5 of the wiring sheet 1 is extended from the upper flexible wiring sheet surface 1a to the lower flexible wiring sheet surface 1c via the side flexible wiring sheet surface 1b covering side surfaces of the base member 2. A group of electrodes 4b to be connected with an object are arranged on the lower lead pattern portion 5c which is formed on the lower flexible wiring sheet surface 1c. The overall IC or an IC connection portion is sealed on the upper surface of the upper flexible wiring sheet 1a.

Figure 6:
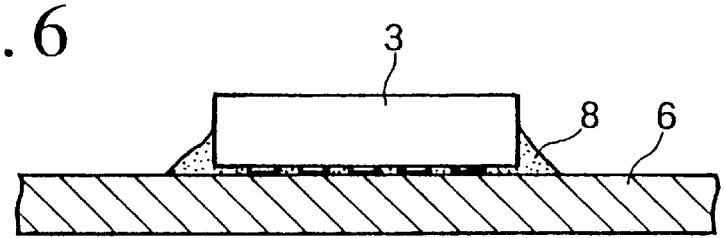
FIG. 6 is a sectional view exemplifying a sealing structure of an IC.

Reference numeral 8 denotes a seal member. The IC is sealed by resin such that the overall IC is embedded in a synthetic resin material (seal member) as shown in FIG. 1B. It is also an acceptable alternative that the IC connection portion is embedded in the synthetic resin material (seal material 8) but the IC body is exposed as shown in FIG. 6. Although not shown, the overall IC may be covered with a cover member, which is formed of either electrically conductive or electrically insulative member. An inert gas is filled in an internal space of the cover member, so that the IC 3 is confined in the inert gas.

In FIG. 1, a single flexible sheet 1 is wound around the base member 2 over the upper surface, opposite side surfaces and lower surface of the base member 2. Then, the IC 3 is bonded, by suitable means, to the electrodes 4a provided on the upper lead pattern portion 5a laid along the upper flexible wiring sheet surface 1a. Electrodes 4b provided on the lower lead pattern portion 5c laid along the lower flexible wiring sheet surface 1c are connected to an object, such as the wiring circuit board 6.

The wiring sheet 1 of the first embodiment shown in FIG. 1 has a loading space 7 on a central portion thereof for the IC 3 as shown in a development view of FIG. 1D. The lead pattern 5 is extended from the opposite two sides of the IC loading space 7 to the opposite two sides of the wiring sheet 1. The lead pattern 5 is arranged at narrow pitches on an inner end of the lead pattern 5 reaching the IC loading space 7. The electrodes 4a to be connected with the IC 3 are formed on this inner end of the lead pattern 5. The lead pattern 5 is arranged at wide pitches on an outer end thereof reaching a side edge of the wiring sheet 1. The electrodes 4b to be connected to the wiring circuit board 6, etc. are formed on this outer end.

Accordingly, when the flexible wiring sheet 1 is wound around the base member 2 in such a manner to enclose the body member 2, opposite ends of the sheet 1 are in opposing relation at the lower surface of the base member 2, as shown in FIG. 1B, thereby forming the lower flexible wiring sheet surface portion 1c. The opposed lower flexible wiring sheets 1c are provided with the electrodes 4b, respectively. As shown in FIG. 1D, those electrodes 4b are arranged in the direction the wiring sheet is wound, and are uniformly scattered over the lower surface of the base member 2.

As means for connecting the electrodes 4b to an object, such as the wiring circuit board 6 or the like, spherical electrodes 4b' formed of electrically conductive metal having a lower melting point are provided. The electrodes 4b' are thermally bonded onto the pads of the wiring circuit board 6.

Aside from providing spherical electrodes 4b' as the electrodes 4b, bumps having other configurations than spherical may be formed on an end portion of the lower lead pattern portion 5c. It is also an interesting alternative to use flat pads, or to use the end portion of the pattern 5 directly as the electrodes 4b.

As the flexible wiring sheet 1 shown in the embodiments of FIGS. 1A–1D, there may be employed a single surface wiring sheet in which the lead pattern 5 is laid along the upper surface of the upper flexible wiring sheet 1a to the lower surface of the lower flexible wiring sheet 1c via the outer side surfaces of the side flexible wiring sheet 1b. In the alternative, there may be employed a double surface wiring sheet 1 in which the lead pattern 5 is laid long from the inner and outer surfaces of the upper flexible wiring sheet 1a to the inner and outer surface of the lower flexible wiring sheet 1c via the inner and outer side surfaces of the side flexible wiring sheet 1b.

Figure 5:
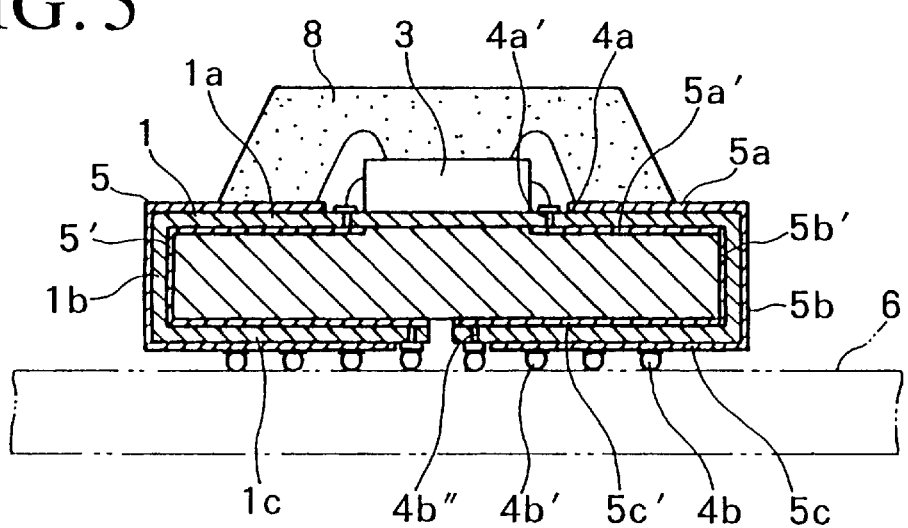
FIG. 5 is a sectional view showing an eighth embodiment of the IC package.

FIG. 5 exemplifies a case where an IC package is formed using the double surface wiring sheet 1. As illustrated, the IC 3 is loaded on the upper surface of the wiring sheet 1 at its central portion, a part of the electrodes had by the IC 3 are bonded by suitable means to one end of the lead pattern 5 laid along the outer surface of the wiring sheet 1, and the remaining electrodes of the IC 3 are bonded by suitable means to one end of the lead pattern 5' laid along the inner and outer surfaces of the wiring sheet 1. One end (one end of the upper lead pattern portion 5a') of the lead pattern 5' laid along the inner and outer surfaces of the wiring sheet 1 is provided with electrodes 4a' piercing through a film of the wiring sheet 1 so that the electrodes 4a' are connected to the IC 3.

On the other hand, electrodes 4b' having a spherical configuration or other configurations are, as shown in FIG. 1D, arranged in the direction that the wiring sheet is wound and arranged in an array (many rows) on the lower lead pattern portion 5c and the inner surface of the lower wiring sheet portion 1c, such that the electrodes 4b' are uniformly arranged over the overall lower surface of the lower wiring sheet 1c.

The lower lead pattern portion 5c' of the inner surface side of the wiring sheet is provided on its end portion with electrodes 4b'' which pierce through the wiring sheet 1. The electrodes 4b have spherical configurations or other configurations and are integrally disposed on the outer surface of the electrodes 4b''.

Referring to an arrangement of the electrodes 4b' (4b), as shown in FIG. 1D, the lower lead pattern portions 5c, 5c', laid in parallel lines on the lower wiring sheet 1c, are divided into a plurality of groups. The length of each group is reduced in steps in the winding direction of the lead so that the lead ends are offset in steps in the same direction. The electrodes 4b' are disposed on the respective ends so that the electrodes 4b' are uniformly arranged on the surface of the lower wiring sheet 1c.

The flexible wiring sheet 1 of FIG. 1 is a single or double surface flexible wiring sheet, in which the lead pattern 5 or 5' is composed of a required conductive foil (metal foil) and is formed on the surface of a thin insulative film 1'.

The insulative film 1' is about 0.02 mm to 0.1 mm in thickness and has heat resisting properties and electrically insulative properties. Further, the insulative film 1' has moisture resisting and chemically corrosive gas resisting properties. Accordingly, a flexible material can be utilized. Acceptable material includes polyimide film, liquid crystal polymer film, polyphenylene sulfide film, polyether-imide film, polyether-etherketone film, polyamide-imide film, and the like. For the metal foil, copper, aluminum, gold, silver, nickel, etc. can be used. Similarly, a conductive resin composed of silver, copper power and resin is also suitable for this purpose.

On the other hand, it is sufficient that the base member 2 has rigidity and heat resistance sufficient for retaining the configuration of the film. Ceramic material, metal material, synthetic resin material, etc. may be used. Acceptable material includes an alumina plate, a brass plate, an aluminum plate, a nickel plated copper plate, a 42-arroy plate, a glass reinforced epoxy resin plate, paper reinforced phenol plate, a glass reinforced polyimide resin, etc. An elastomer may also be used as the base member 2.

This base member 2 is slightly larger in size than a semiconductor chip (IC 3) and suitably from 0.2 mm to 1.5 mm in thickness. The flexible wiring sheet 1 is bonded to the outer peripheral surface of the base member 2 through an adhesive agent having heat resistance and bond strength. As this adhesive agent, an epoxy resin adhesive agent or an acrylic adhesive agent are suitably used. The IC package according to the present invention can be formed into a packet having a structure like that of the LGA (leadless grid array), BGA or CSP.

Next, modified embodiments of the IC package described with reference to FIG. 1 are described with reference to FIGS. 2 through 4.

Figure 2A:
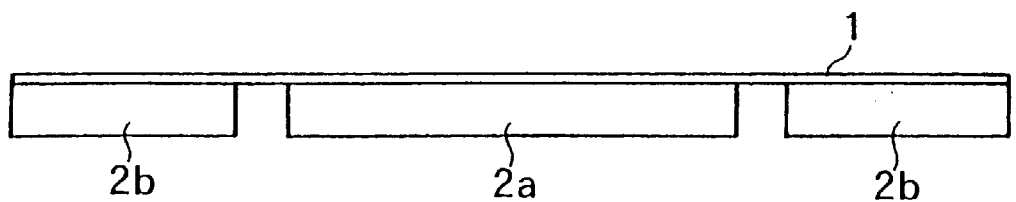
FIG. 2A is a side view of a flexible wiring sheet used in a fifth embodiment.
Figure 2B:
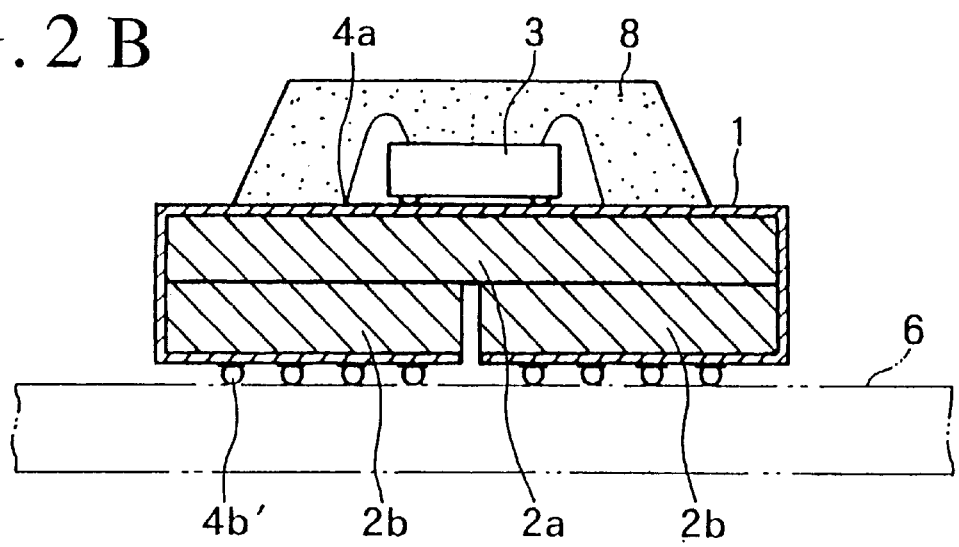
FIG. 2B is a sectional view of the IC package.
Figure 3:
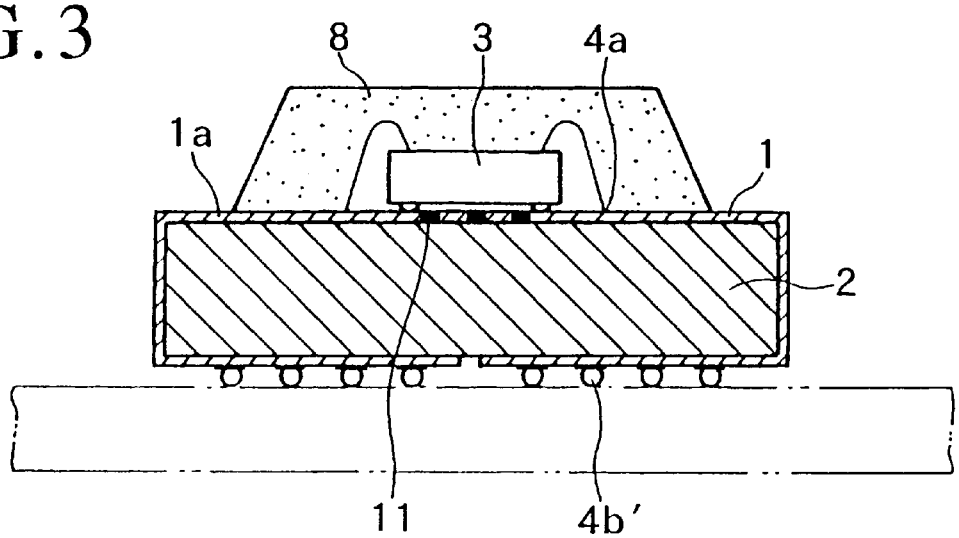
FIG. 3 is a sectional view showing a sixth embodiment of the IC package.

FIGS. 2A and 2B show an example in which the base member 2 is formed of a laminated plate. As shown, for example, in FIG. 2A, the flexible wiring sheet 1 is provided with plates which are bonded to its central portion and opposite end portions, respectively. The sheet 1 is bent in such a manner to superpose one plate upon the other. By doing so, a laminated structure of the two plates 2a, 2b can be formed as shown in FIG. 2B. With this structure, the IC package body portion can easily be formed merely by folding in superposed relation the wiring sheet together with the plates.

The base member of FIGS. 1 through 2 can serve as the heat radiating member of the IC 3 by being formed of metal having favorable heat conductive properties such as copper. In order to enhance the heat radiating properties, in FIG. 3, the upper flexible wiring sheet portion 1a which is interposed between the IC 3 and the base member 2 is provided with a through-hole, and a heat conductive metal or other material chiefly composed of metal is retained within the through-hole to form a heat inlet path 11. Therefore, heat readily flows from the IC 3 to the base member 2 through heat path 11. When the flexible wiring sheet 1 is wound around the base member 2 from the upper surface of the base member 2 via the opposite two side surfaces, the remaining two side surfaces of the base member 2 are in exposed condition. Therefore, such exposed two side surfaces can serve as favorable heat radiating surfaces.

Figure 4:
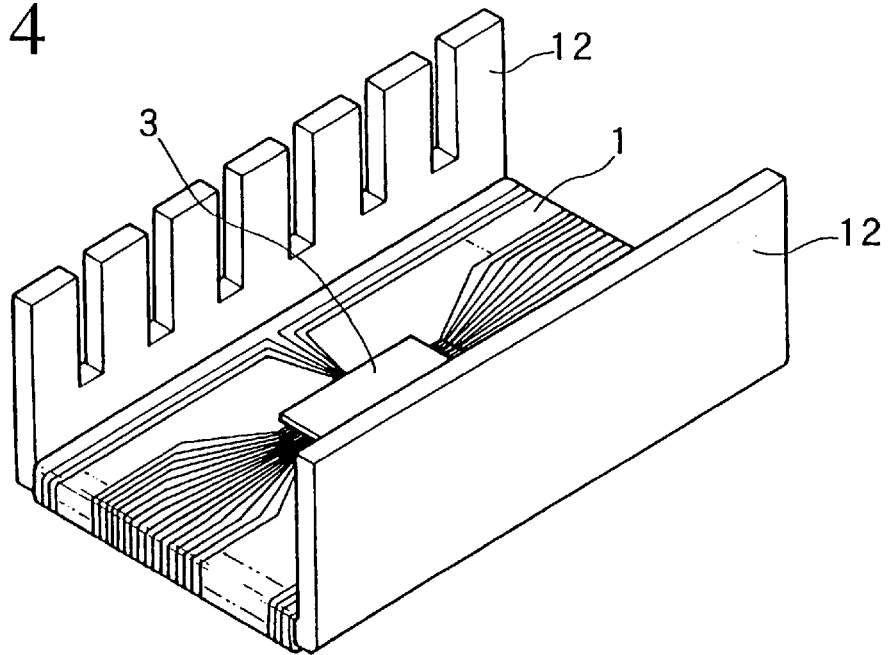
FIG. 4 is a perspective view showing a seventh embodiment of the IC package.

FIG. 4 shows another example in which both ends of the base member 2 are projected outwardly at the exposed surfaces from the wiring sheet, so that heat radiating fins 12 are formed. The heat radiating fins 12 are erected upwardly in opposing relation and cut into a comb teeth configuration in order to enhance the heat radiating effect. Of course, the configuration of the heat radiating fins 12 is not limited to the above, and any other suitable configuration may be employed.

Although the illustrated examples show a single IC retained in a single IC package, the present invention also includes an MCM in which a single IC package retains therein a plurality of ICs.

According to the present invention, by using a copper foil having a thickness of about 10 $\mu$m, for example, as the metal foil, an extremely finely designed lead pattern can be formed. A 60 $\mu$m pitch arrangement, which is currently said to be the finest pitch arrangement, can also easily be realized using the known photo lithographic technique. Since there is no need of such interlayer connection techniques nor such highly precise interlayer matching techniques, which were conventionally required for forming the multilayer wiring plate, and since a fine wiring is available, the pattern can be arranged in high density. Thus the IC package of the present invention can be applied not only to an IC having a plurality of pins but also to an IC having a fine pitch arrangement. Moreover, in the IC package of the present invention, patterning can easily be made, and productivity is extremely high. Moreover, the structure is simple, since an interposer and a small-sized package having a plurality of pins can be manufactured in a simple manner and at a low manufacturing cost. Thus, the economical advantages are enormous.

Although the present invention has been described in the form of preferred embodiments, the present invention is by no means limited to the above embodiments. Various changes and modifications can be made without departing from the scope of the appended claims.

What is claimed is:

1. An integrated circuit package comprising:
   a base member having an upper surface, outer side surfaces, and a lower surface;
   a unitary wiring sheet having an upper surface, a pair of side surfaces, a pair of lower surfaces, and a pair of ends, wherein said wiring sheet is wrapped about said base member so that said upper surface of said wiring sheet overlays said upper surface of said base member, said pair of side surfaces of said wiring sheet overlay said outer side surfaces of said base member, said pair of lower surfaces of said wiring sheet overlay said lower surface of said base member, and said pair of ends of said wiring sheet face each other in a parallel opposing relation along said lower surface of said base member;
   upper electrodes arranged on said upper surface of said wiring sheet;
   lower electrodes arranged on said lower surfaces of said wiring sheet;
   a lead pattern disposed on said wiring sheet, said lead pattern connected between said upper electrodes and said lower electrodes, said lead pattern extending from said upper electrodes to said lower electrodes via said side surfaces of said wiring sheet; and
   an IC positioned on said upper surface of said wiring sheet, wherein a connection is formed between said IC and said upper electrodes.

2. The IC package of claim 1, further comprising a sealant enclosing said connection between said IC and said upper electrodes.

3. The IC package of claim 1, wherein said lead pattern disposed on said wiring sheet comprises a plurality of discrete conductive paths.

4. The IC package of claim 1, further comprising a cover member forming an enclosure around said IC, said enclosure being filled with inert gas.

5. The IC package of claim 1, wherein an insulative film is formed on said wiring sheet.

6. The IC package of claim 1, wherein said wiring sheet includes a lead pattern disposed on each of inner and outer surfaces of said wiring sheet.

7. The IC package of claim 1, wherein said base member comprises laminated plates.

8. The IC package of claim 1, wherein said base member comprises a heat absorbing material.

9. The IC package of claim 8, wherein said base member has a projecting portion, said projecting portion of said base member having heat radiating fins.

10. The IC package of claim 8, wherein said upper surface of said wiring sheet has a portion interposed between said IC and said base member, said portion of said wiring sheet having at least one through hole.

11. The IC package of claim 10, wherein said at least one through hole is filled with heat conductive material.

12. An integrated circuit package comprising:
   a base member having an upper surface, outer side surfaces, and a lower surface;
   a unitary wiring sheet having an upper surface, a pair of side surfaces, a pair lower surfaces, and a pair of ends, wherein said wiring sheet covers each of said upper surface, outer side surfaces, and lower surfaces of said base member so that said pair of said wiring sheet face each other in a parallel opposing relation along said lower surface of said base member;
   upper electrodes arranged on said upper surface of said wiring sheet;
   lower electrodes arranged on said lower surfaces of said wiring sheet;
   a lead pattern disposed on said wiring sheet, said lead pattern connected between said upper relectrodes and said lower electrodes, said lead pattern extending from said upper electrodes to said lower electrodes around at least one of said outer side surfaces of said base member; and
   an IC positioned on said upper surface of said wiring sheet, wherein a connection is formed between said IC and said upper electrodes.

13. The IC package of claim 12, further comprising a sealant enclosing said connection between said IC and said upper electrodes.

14. The IC package of claim 12, wherein said lead pattern disposed on said wiring sheet comprises a plurality of discrete conductive paths.

15. The IC package of claim 12, further comprising a cover member forming an enclosure around said IC, said enclosure being filled with inert gas.

16. The IC package of claim 12, wherein an insulative film is formed on said wiring sheet.

17. The IC package of claim 12, wherein said wiring sheet includes a lead pattern disposed on each of inner and outer surfaces of said wiring sheet.

18. The IC package of claim 12, wherein said base member comprises laminated plates.

19. The IC package of claim 12, wherein said base member comprises a heat absorbing material.

20. The IC package of claim 19, wherein said base member has a projecting portion, said projecting portion of said base member having heat radiating fins.

21. The IC package of claim 19, wherein said upper surface of said wiring sheet has a portion interposed between said IC and said base member, said portion of said wiring sheet having at least one through hole.

22. The IC package of claim 21, wherein said at least one through hole is filled with heat conductive material.

23. The integrated circuit package of claim 1, wherein said upper surface of said wiring sheet includes a central portion, said IC being positioned on said central portion.

24. The integrated circuit package of claim 13, wherein said pair of ends of said wiring sheet are adjacent to each other.

25. The integrated circuit package of claim 1, wherein said pair of ends of said wiring sheet are adjacent to each other.

26. The integrated circuit package of claim 12, wherein said upper surface of said wiring sheet includes a central portion, said IC being positioned on said central portion.

27. The integrated circuit package of claim 16, wherein said pair of ends of said wiring sheet are adjacent to each other.

28. The integrated circuit package of claim 12, wherein said pair of ends of said wiring sheet are adjacent to each other.

* * * * *